United States Patent
Maeda

(10) Patent No.: US 9,939,753 B2
(45) Date of Patent: Apr. 10, 2018

(54) PRINTED CIRCUIT BOARD, EXPOSURE DEVICE HAVING PRINTED CIRCUIT BOARD, AND IMAGE FORMING APPARATUS

(71) Applicant: CANON KABUSHIKI KAISHA, Tokyo (JP)

(72) Inventor: Yasukazu Maeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/957,414

(22) Filed: Dec. 2, 2015

(65) Prior Publication Data

US 2016/0161880 A1 Jun. 9, 2016

(30) Foreign Application Priority Data

Dec. 8, 2014 (JP) .................. 2014-248172

(51) Int. Cl.
*G03G 15/043* (2006.01)
*H05K 3/28* (2006.01)
*G03G 15/04* (2006.01)
*G03G 15/00* (2006.01)
*H05K 3/00* (2006.01)

(52) U.S. Cl.
CPC ..... *G03G 15/043* (2013.01); *G03G 15/04072* (2013.01); *G03G 15/80* (2013.01); *H05K 3/0052* (2013.01); *G03G 2215/0132* (2013.01)

(58) Field of Classification Search
None
See application file for complete search history.

(56) References Cited

U.S. PATENT DOCUMENTS

| 5,165,990 | A | * | 11/1992 | Nakano | ................ | B29C 70/12 |
| | | | | | | 428/132 |
| 2008/0057270 | A1 | * | 3/2008 | Miki | ................ | C09J 4/06 |
| | | | | | | 428/131 |
| 2010/0315791 | A1 | * | 12/2010 | Hatakeyama | ........ | H05K 3/0052 |
| | | | | | | 361/752 |
| 2011/0240325 | A1 | * | 10/2011 | Suzuki | ................ | H05K 3/0052 |
| | | | | | | 174/50 |

FOREIGN PATENT DOCUMENTS

| JP | H0529753 | A | | 2/1993 |
| JP | H10173320 | A | | 6/1998 |
| JP | 3009783 | B2 | | 2/2000 |
| JP | 2000151032 | A | * | 5/2000 |
| JP | 2004281533 | A | | 10/2004 |
| JP | 2007088232 | A | | 4/2007 |
| JP | 2011176007 | A | | 9/2011 |
| JP | 2011187514 | A | * | 9/2011 |

* cited by examiner

*Primary Examiner* — Clayton E Laballe
*Assistant Examiner* — Leon W Rhodes, Jr.
(74) *Attorney, Agent, or Firm* — Canon U.S.A., Inc. IP Division

(57) ABSTRACT

A printed circuit board of which a part of at least one side of the circuit board is divided by a division process including a first area where a component is placed, and a divided portion where the component is not placed, and which includes the part of the at least one side. Silk is applied to an entire area of the divided portion.

16 Claims, 10 Drawing Sheets

▨ AREA WHERE COMPONENT IS PLACED

☐ AREA WHERE COMPONENT IS NOT PLACED

| | |
|---|---|
|  | AREA WHERE COMPONENT IS PLACED |
|  | AREA WHERE COMPONENT IS NOT PLACED |
|  | AREA WHERE SILK IS APPLIED |

PRINTED CIRCUIT BOARD, EXPOSURE DEVICE HAVING PRINTED CIRCUIT BOARD, AND IMAGE FORMING APPARATUS

BACKGROUND OF THE INVENTION

Field of the Invention

The present disclosure relates to a printed circuit board divided by a division process.

Description of the Related Art

As one of image defects in an image forming apparatus such as a laser beam printer, there is an image defect termed a "white spot of an image". This image defect occurs by minute dirt adhering to an optical component (a lens or a mirror) in an exposure unit (also referred to as "scanner unit") 9 of the image forming apparatus. Examples of the minute dirt include shavings of a printed circuit board on which a control circuit for controlling the operation of the exposure unit 9 is mounted.

For example, a description will now be given of a printed circuit board on which a light-emitting element driving circuit 10 of the exposure unit 9 is mounted, and the production of shavings of the printed circuit board. FIG. 3 is a view of a board member 31 on one surface (a component surface or a soldering surface) thereof. As illustrated in FIG. 3, the board member 31 is a single board from which printed circuit boards 32 (32a, 32b, 32c, and 32d) can be obtained as a plurality of surfaces. In FIG. 3, actually, a connection portion is provided between the printed circuit boards 32b and 32c, but is not illustrated. As illustrated in FIG. 3, the printed circuit boards 32 (32a, 32b, 32c, and 32d) are joined together by narrow joint portions 33, thereby forming the single board member 31. Further, slit portions 34 illustrated in FIG. 3 are hollow portions in the board member 31. The joint portions 33 (dotted line portions in FIG. 3) are cut with a router or the like in this state, thereby dividing the printed circuit boards 32 into single boards 32a, 32b, 32c, and 32d. When the joint portions 33 are cut with a router or the like, shavings are produced.

As described above, many lenses and mirrors are provided in the image exposure unit 9 of the image forming apparatus. If minute shavings adhere to the lenses and the mirrors, an image defect occurs. Thus, in a factory handling an optical unit such as the exposure unit 9, it is necessary to minimize the production of shavings.

As a method for reducing shavings produced when a printed circuit board is cut, Japanese Patent Application Laid-Open No. 2007-88232 is known. Japanese Patent Application Laid-Open No. 2007-88232 discusses a configuration in which, after a printed circuit board is cut, a resist is applied to cover the cut end surfaces.

In Japanese Patent Application Laid-Open No. 2007-88232, the process of applying a resist to the cut end surfaces of the printed circuit board is provided after the printed circuit board is cut. This may increase manufacturing effort and manufacturing costs.

SUMMARY OF THE INVENTION

The present disclosure is directed to a printed circuit board obtained with reduced manufacturing processes and costs and also reduced shavings.

According to an aspect of the present disclosure, a printed circuit board of which a part of at least one side is divided by a division process, includes a first area where a component is placed, and a divided portion where the component is not placed, and which includes the part of the at least one side, wherein silk is applied to an entire area of the divided portion.

According to another aspect of the present disclosure, an exposure device includes a printed circuit board having a driving circuit for emitting light, wherein the printed circuit board is a printed circuit board of which a part of at least one side is divided by a division process, and the printed circuit board includes a first area where a component is placed, and a divided portion where the component is not placed, and which includes the part of the at least one side, and wherein silk is applied to an entire area of the divided portion.

According to yet another aspect of the present disclosure, an image forming apparatus includes an image bearing member on which an image is formed, an exposure unit configured to form a latent image on the image bearing member, a developing unit configured to develop the latent image formed on the image bearing member, and a transfer unit configured to transfer the image developed on the image bearing member, wherein the exposure unit has a driving circuit for emitting light and includes a printed circuit board of which a part of at least one side is divided by a division process, wherein the printed circuit board includes a first area where a component is placed, and a divided portion where the component is not placed, and which includes the part of the at least one side, and wherein silk is applied to an entire area of the divided portion.

Further features of the present disclosure will become apparent from the following description of exemplary embodiments with reference to the attached drawings.

DESCRIPTION OF THE EMBODIMENTS

Exemplary embodiments of the present disclosure will be described below with reference to the drawings. It is to be understood that the following exemplary embodiments are not intended to limit the scope of the invention set forth in the appended claims and that not all the combinations of features described in the exemplary embodiments are essential to the technical solution provided by the present disclosure.

(Example of Apparatus to which Present Disclosure is Applied)

Figure 1:
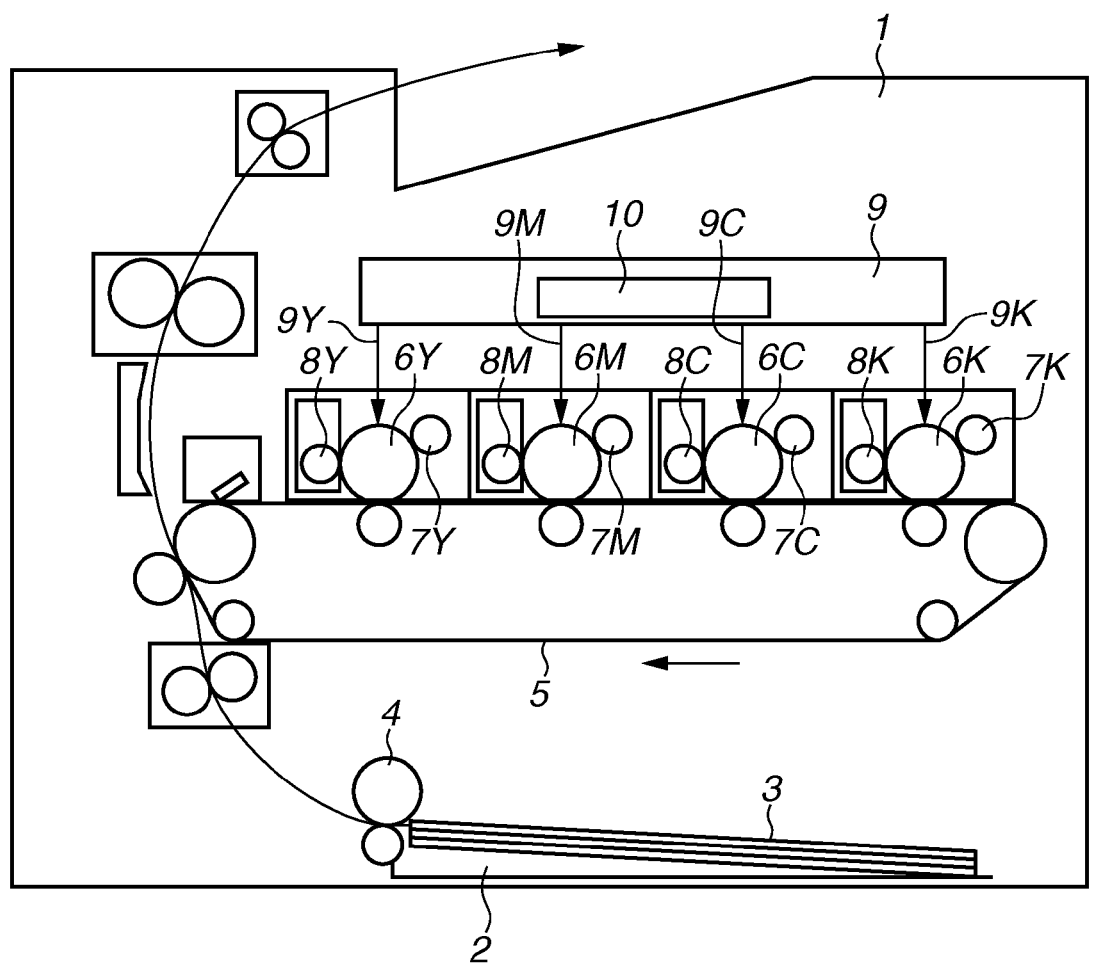
FIG. 1 is a diagram illustrating an example of a schematic cross-sectional view of an image forming apparatus, in accordance with one or more aspect of the present disclosure.

A description will now be given below of a configuration of a color image forming apparatus as an example of an apparatus to which the present disclosure is applied. FIG. 1 is an example of a schematic cross-sectional view of the color image forming apparatus. An image forming apparatus 1 includes a photosensitive drum 6 (6Y, 6M, 6C, 6K) serving as an image bearing member. The image forming apparatus 1 sequentially and successively transfers, in a superimposed manner, images onto an intermediate transfer member (intermediate transfer belt) 5 serving a second image bearing member. Then, the image forming apparatus 1 transfers the image onto a recording material 3 stacked in a sheet feeding cassette 2, thereby obtaining a color image. The four photosensitive drums 6Y, 6M, 6C, and 6K are arranged in series in the moving direction of the intermediate transfer belt 5. In the process of rotation, the photosensitive drum 6 (6Y, 6M, 6C, 6K) is uniformly charged to a potential of a predetermined polarity by a primary charging roller 7 (7Y, 7M, 7C, 7K), and then receives light 9 (9Y, 9M, 9C, 9K) from an exposure unit 9 including a light-emitting element driving circuit 10. This forms an electrostatic latent image corresponding to an image of a first color (yellow) of a target color image. A first developing device (yellow developing device) 8 (8Y, 8M, 8C, 8K) adheres toner (yellow, magenta, cyan, black), which is the first color, to the electrostatic latent image, thereby developing the electrostatic latent image. Then, the developed image is transferred onto the recording material 3 fed by a sheet feeding roller 4.

Figure 2:
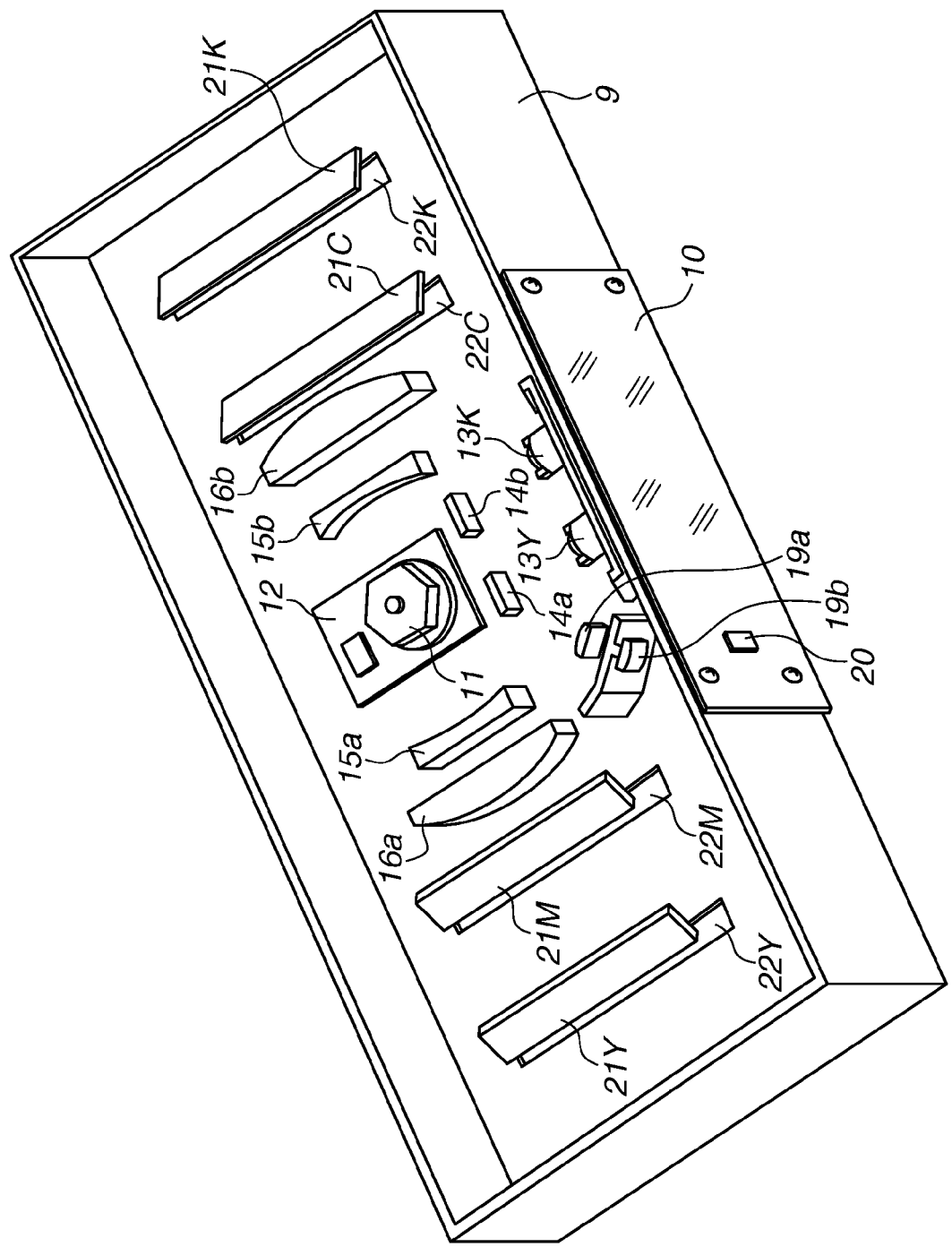
FIG. 2 is a diagram illustrating an example of an external perspective view of an exposure unit, in accordance with one or more aspect of the present disclosure.
Figure 3:
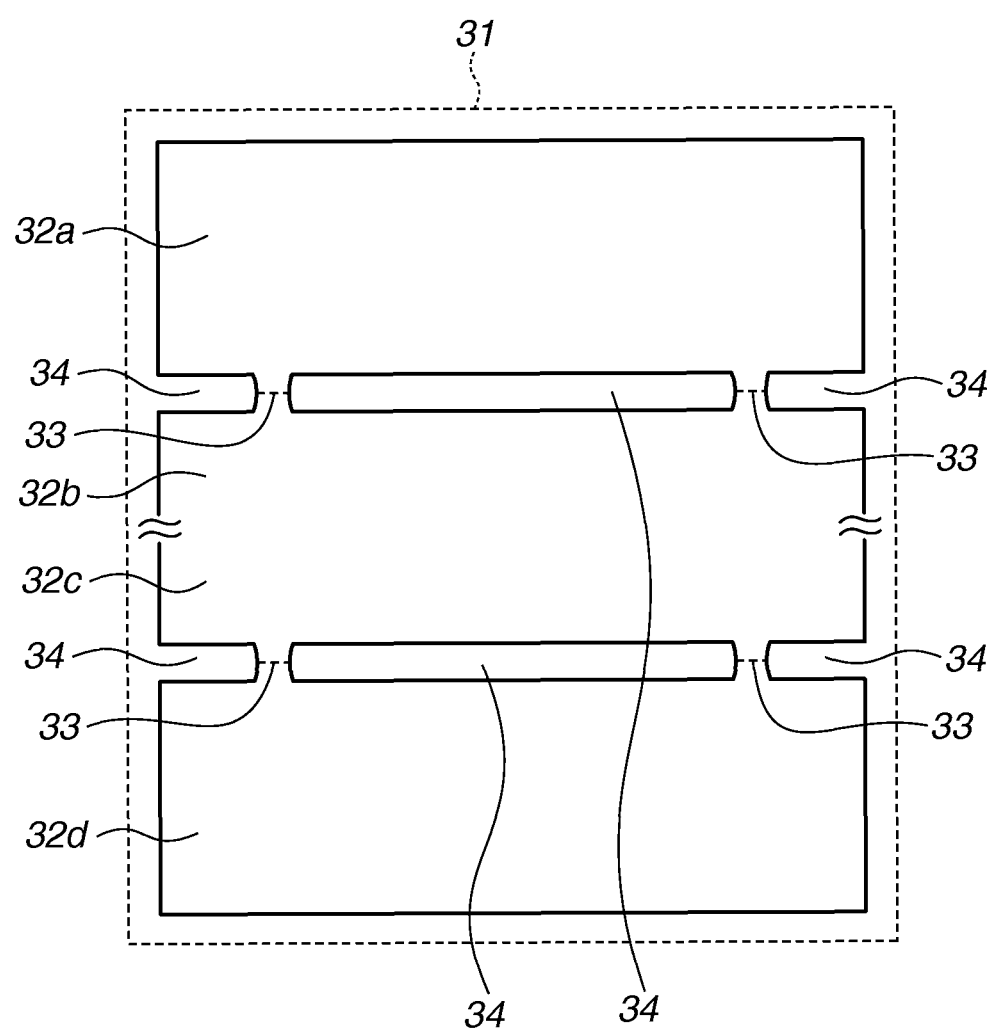
FIG. 3 is a diagram illustrating a board member 31, in accordance with one or more aspect of the present disclosure.

Next, the exposure unit 9 will now be described. FIG. 2 is a schematic perspective view of the exposure unit (also referred to as "scanner unit") 9. A light source unit 13 (13Y, 13K) includes a semiconductor laser (not illustrated), a collimator lens barrel (not illustrated), a collimator lens (not illustrated), and a diaphragm (not illustrated), and the driving circuit 10 for driving the semiconductor laser (a light-emitting element). The light-emitting element driving circuit 10 supplies driving current to the semiconductor laser, whereby laser light is emitted and enter the collimator lens. The collimator lens converts the laser light into parallel light. Next, the laser light emitted from the light source unit 13 (13Y, 13K) is condensed on a rotating polygon mirror 11 by a cylindrical lens 14 (14a, 14b). The condensed laser light is deflected by the rotating polygon mirror 11, which is driven to rotate by a rotating polygon mirror driving circuit 12. Then, the deflected laser light passes through a toric lens 15 (15a, 15b), a cylindrical lens 16 (16a, 16b), a reflecting mirror 21 (21Y, 21M, 21C, 21K), and an opening portion 22 (22Y, 22M, 22C, 22K). Then, the laser light is emitted onto (forms an image on) the photosensitive drum 6 (6Y, 6M, 6C, 6K) in FIG. 1, and the photosensitive drum 6 is scanned with the laser light. A detection element 20 for detecting a beam detection (BD) signal is used for receiving the laser light to generate a horizontal synchronization signal, and is provided on the scanning line of the laser light. An imaging lens 19 (19a, 19b) is a lens for focusing the laser light deflected by the rotating polygon mirror 11 on the detection element 20.

Next, specific exemplary embodiments of the present invention will be described.

Figure 4:
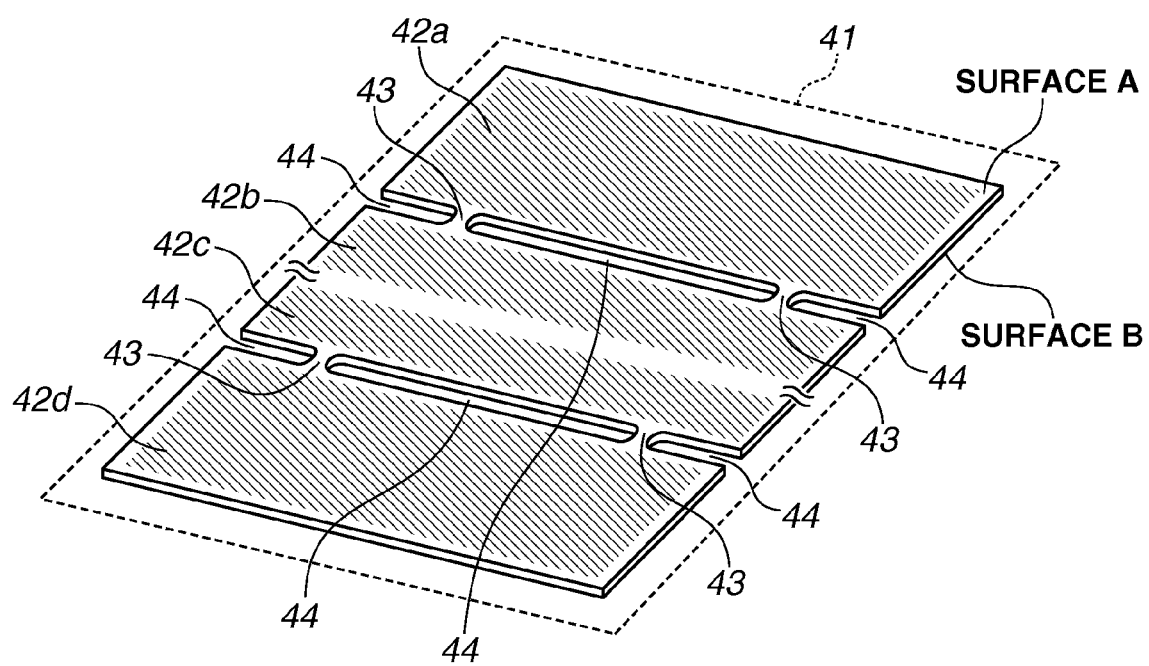
FIG. 4 is a perspective view of a board member 41, in accordance with one or more aspect of the present disclosure.

A first exemplary embodiment will now be described. The present exemplary embodiment is characterized by a configuration in which silk or a resist is applied to one surface of connection portions of a printed circuit board. It is assumed that, as described with reference to FIG. 2, a printed circuit board according to the present exemplary embodiment is provided in the exposure unit 9. As illustrated in FIG. 4, a board member 41 is a single board obtained by joining a plurality of single-sided printed circuit boards 42a, 42b, 42c, and 42d together by connection portions 43. Slit portions 44 are hollow portions in the board member 41. In FIG. 4, actually, a connection portion is provided between the single-sided printed circuit boards 42b and 42c, but is not illustrated. Further, as illustrated in FIG. 4, the surface of the board member 41 on which a lead component is present is a surface A (a component surface), and the surface of the board member 41 on which the lead of the lead component is flow-mounted is a surface B (a soldering surface). The connection portions 43 of the board member 41 are divided with a router or the like. The single-sided printed circuit boards 42a, 42b, 42c, and 42d obtained by dividing the connection portions 43 with the router each serve as a printed circuit board having a divided portion (a part obtained by dividing the corresponding connection portion 43) in a part of at least one side thereof.

Figure 5A:
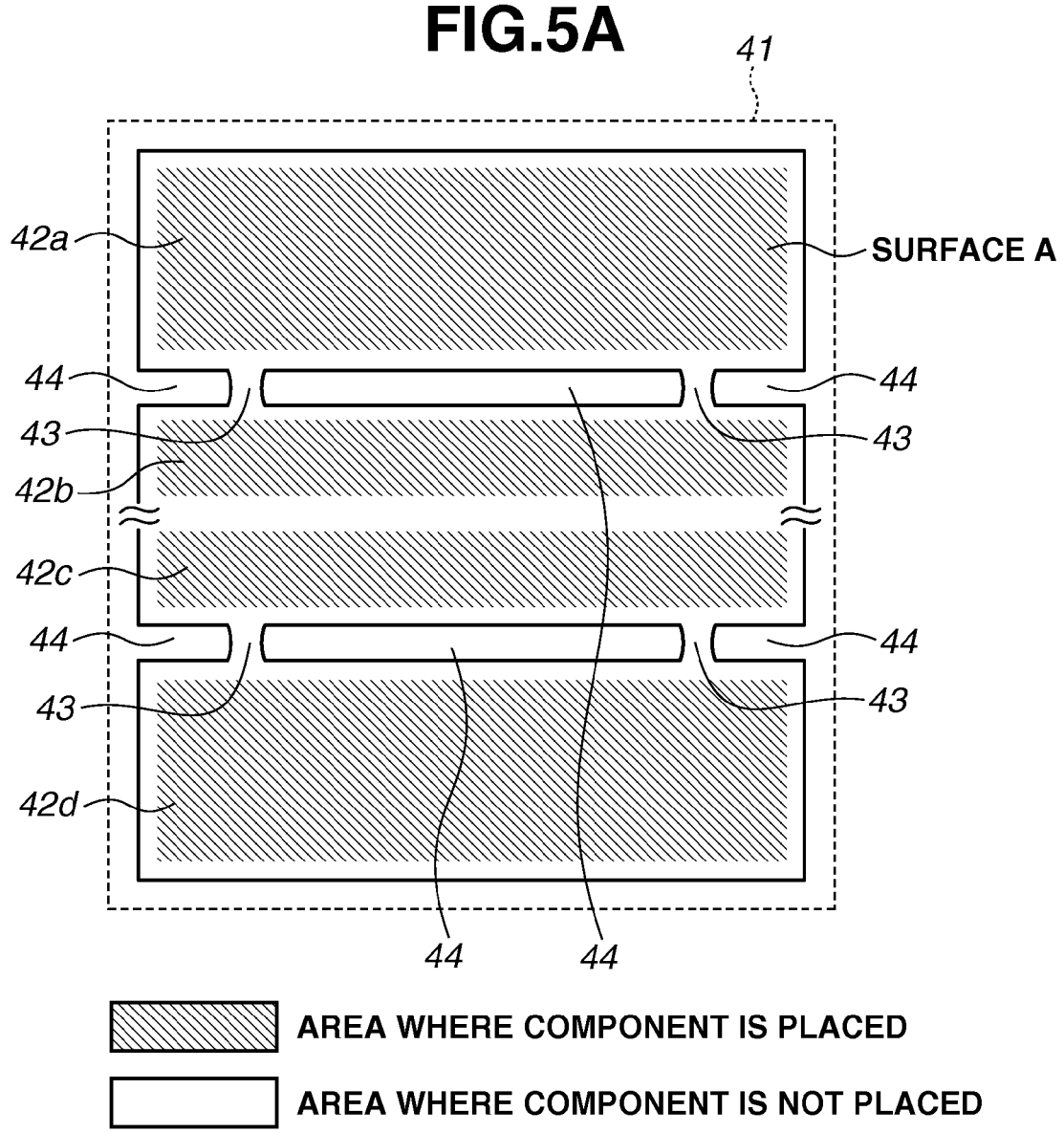
FIGS. 5A and 5B are diagrams illustrating areas of the board member 41, in accordance with one or more aspect of the present disclosure.
Figure 5B:
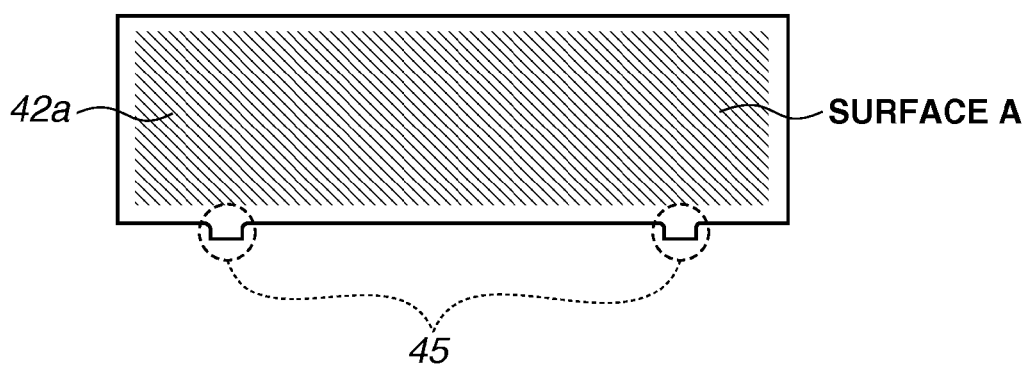

Meanwhile, FIG. 5A is a view of the board member 41 on the surface A. As illustrated in FIG. 5A, on the surface A of the board member 41, there are an area (a first area) where a component is placed, and an area (a second area) where a component is not placed. As illustrated in FIG. 5A, the area where a component is not placed corresponds to an area with a predetermined distance from an end portion of each single-sided printed circuit board, and the connection portions 43. Further, FIG. 5B illustrates the single-sided printed circuit board 42a, which is obtained by dividing the board member 41 in FIG. 5A with a router or the like. In a divided portion 45, a part of the connection portion 43 remains from the board.

Figure 6:
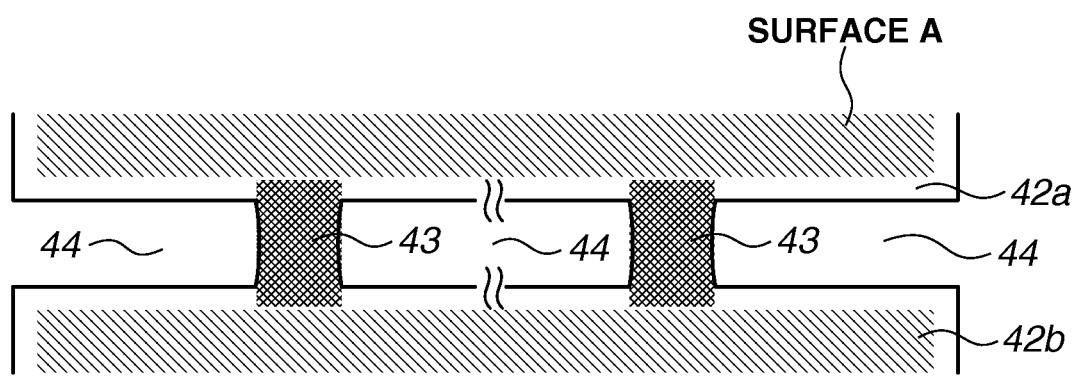
FIG. 6 is a diagram illustrating an area where silk is applied, in accordance with one or more aspect of the present disclosure.
Figure 6:
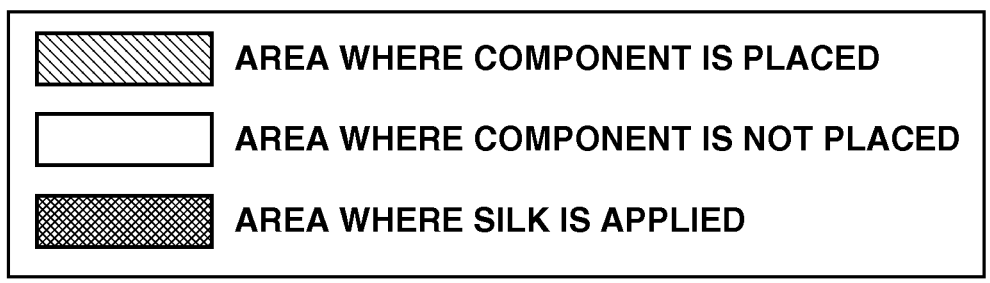

Then, in the present exemplary embodiment, as illustrated in FIG. 6, an area where silk is applied is provided over the entire area of the connection portion 43 on the surface A of the board member 41, and in contact with the areas where a component is placed in the single-sided printed circuit boards 42 joined together by the connection portion 43. If the connection portion 43 is cut with a router or the like with silk being applied to the connection portion 43 in this manner, the production of shavings is more reduced than when silk is not applied.

In the present exemplary embodiment, the description has been given of a configuration in which silk is applied to the connection portions 43 on the surface A of the board member 41. Alternatively, it is possible to obtain the effect also by applying silk to the connection portions 43 on the surface B of the board member 41. Further, in the present exemplary embodiment, the description has been given of a configuration in which silk is applied to the connection portions 43. Alternatively, it is possible to obtain the effect also by applying a resist instead of silk.

As described above, according to the present exemplary embodiment, a single-sided printed circuit board is divided with silk being applied to connection portions of the single-sided printed circuit board. This reduces shavings and also eliminates a working process for measures against shavings after cutting.

Figure 7:
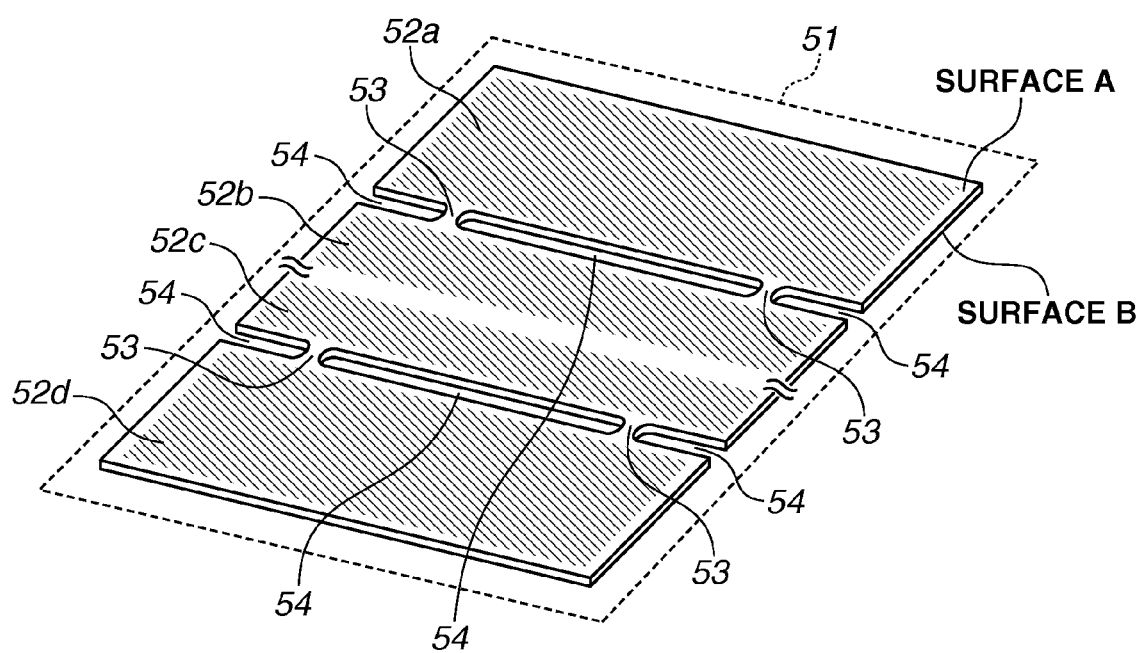
FIG. 7 is a perspective view of a board member 51, in accordance with one or more aspect of the present disclosure.

A second exemplary embodiment will now be described. The present exemplary embodiment is characterized by a configuration in which silk or a resist is applied to both surfaces of connection portions of a printed circuit board. It is assumed that, as described with reference to FIG. 2, a printed circuit board according to the present exemplary embodiment is provided in the exposure unit 9. As illustrated in FIG. 7, a board member 51 is a single board obtained by joining a plurality of double-sided printed circuit boards 52a, 52b, 52c, and 52d together by connection portions 53. Slit portions 54 are hollow portions in the board member 51. In FIG. 7, actually, a connection portion is provided between the double-sided printed circuit boards 52b and 52c, but is not illustrated. Further, as illustrated in FIG. 7, one surface of the board member 51 is a surface A (a component surface), and the other surface of the board member 51 is a surface B (a soldering surface).

Figure 8:
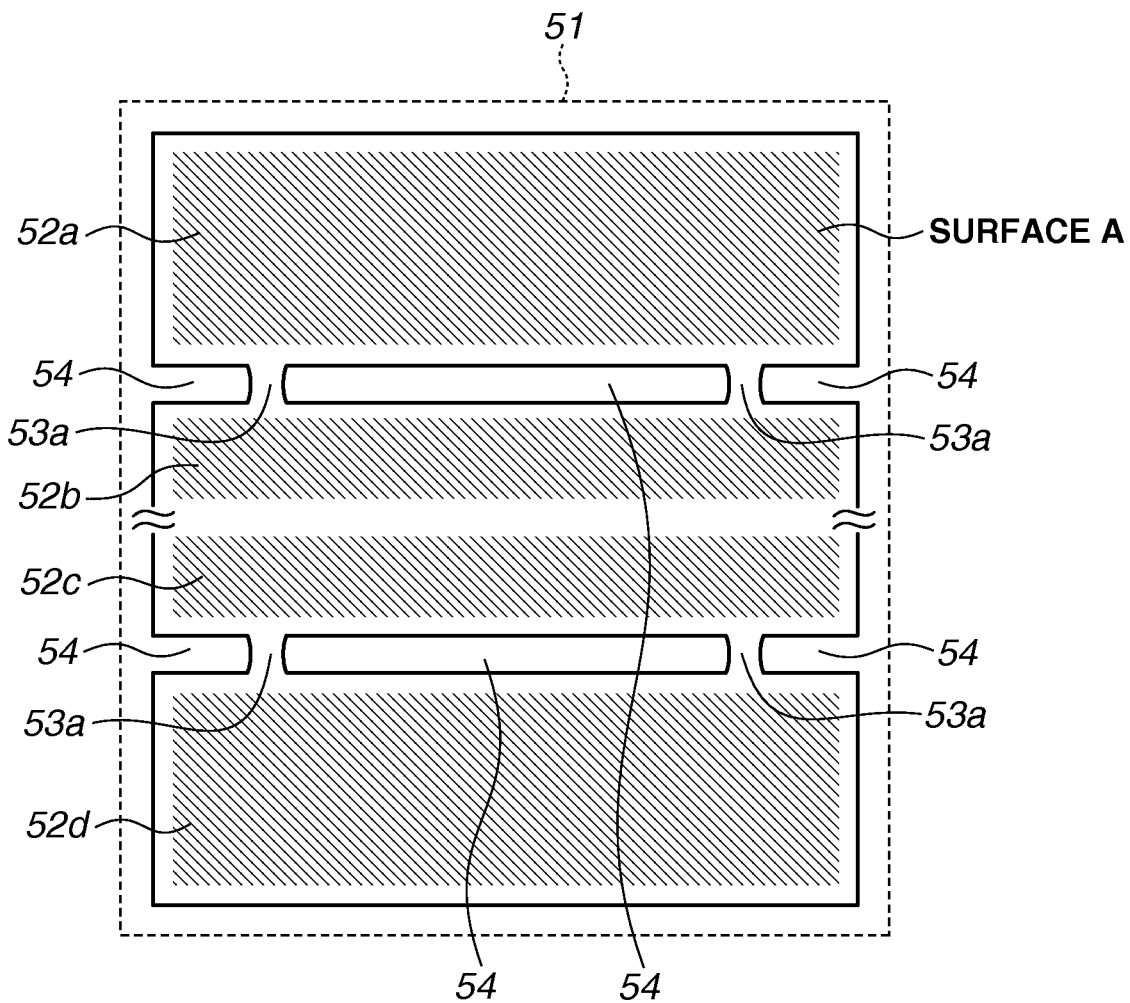
FIG. 8 is a diagram illustrating areas of the board member 51, in accordance with one or more aspect of the present disclosure.
Figure 9A:
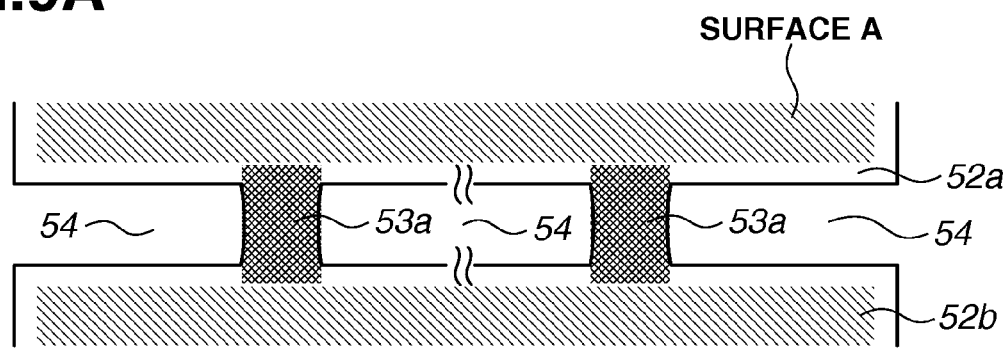
FIGS. 9A and 9B are diagrams each illustrating an area where silk is applied, in accordance with one or more aspect of the present disclosure
Figure 9B:
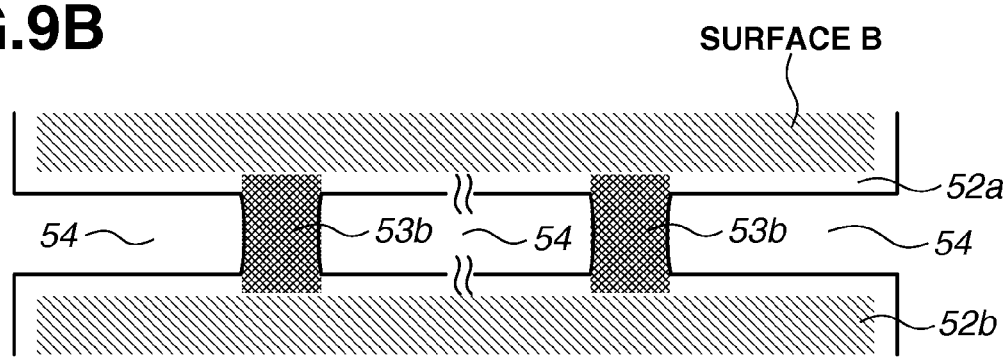
Figure 9B:
Figure 9B:
Figure 9B:

FIG. 8 is a view of the board member 51 on the surface A. Similarly to the first exemplary embodiment, as illustrated in FIG. 8, on the surface A of the board member 51, there are an area where a component is placed, and an area where a component is not placed. Also on the surface B of the board member 51, there are two similar areas. The shape of each of the divided printed circuit boards is similar to that of the first exemplary embodiment (FIG. 5B). Then, in the present exemplary embodiment, as illustrated in FIG. 9A, an area where silk is applied is provided over the entire area of a connection portion 53a on the surface A of the board member 51, and in contact with the areas where a component can be placed in the printed circuit boards 52 joined together by the connection portion 53a. Further, as illustrated in FIG. 9B, an area where silk is applied is provided over the entire area of a connection portion 53b on the surface B of the board member 51, and in contact with the areas where a component is placed in the double-sided printed circuit boards 52 joined together by the connection portion 53b. If the connection portion 53 of the double-sided board is cut with a router or the like with silk being applied to both surfaces of the connection portion 53 in this manner, the production of shavings is more reduced than when silk is not applied.

As described above, according to the present exemplary embodiment, a double-sided printed circuit board is divided with silk being applied to connection portions of the double-sided printed circuit board. This reduces shavings and also eliminates a working process for measures against shavings after cutting.

In the present exemplary embodiment, the description has been given of a configuration in which silk is applied to the connection portion 53a on the surface A of the board member 51 and the connection portion 53b on the surface B of the board member 51. Alternatively, it is possible to obtain the effect also by applying a resist instead of silk.

A third exemplary embodiment will now be described. The present exemplary embodiment is characterized by a configuration in which silk is applied to one surface of connection portions of a printed circuit board, and a resist is applied to the other surface. It is assumed that, as described with reference to FIG. 2, a printed circuit board according to the present exemplary embodiment is provided in the exposure unit 9. The configurations of the board member and the printed circuit board are similar to those of the second exemplary embodiment and therefore are not described here.

Figure 10A:
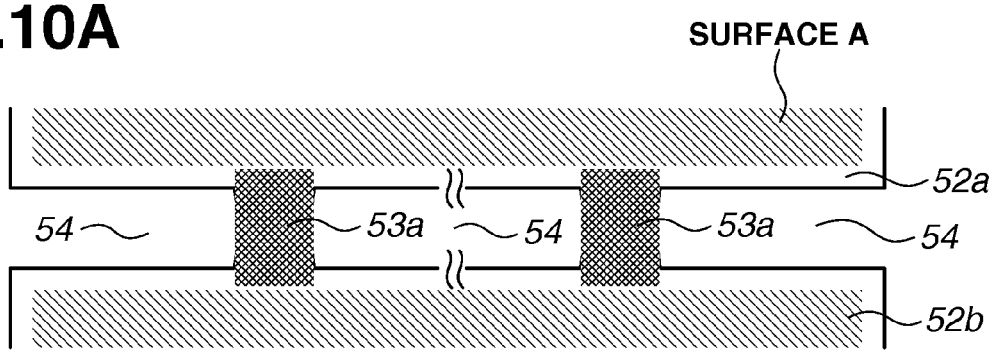
FIGS. 10A and 10B are diagrams respectively illustrating an area where silk is applied and an area where a resist is applied, in accordance with one or more aspect of the present disclosure
Figure 10B:
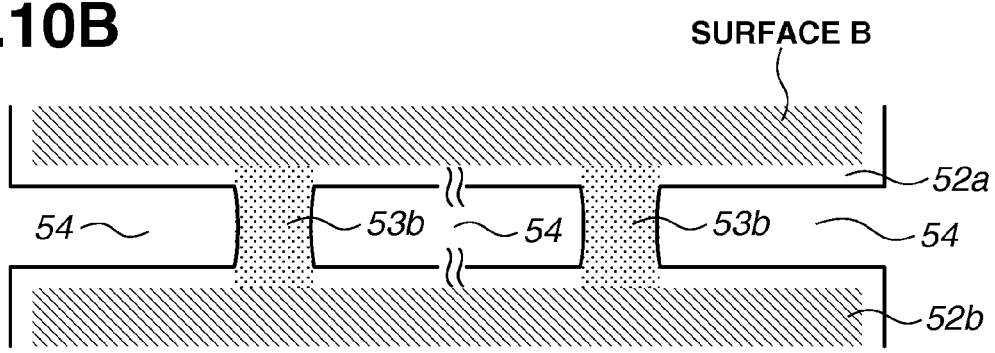
Figure 10B:
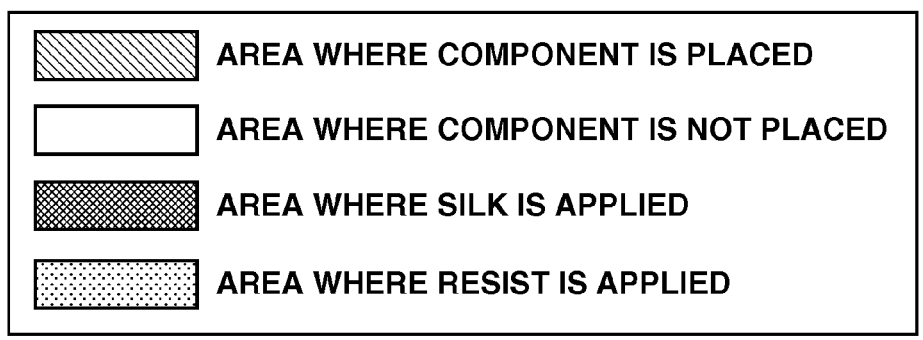

As illustrated in FIG. 10A, an area where silk is applied is provided over the entire area of a connection portion 53a on the surface A of the board member 51, and in contact with the areas where a component is placed in the printed circuit boards 52 joined together by the connection portion 53a. Then, as illustrated in FIG. 10B, an area where a resist is applied is provided over the entire area of a connection portion 53b on the surface B of the board member 51, and in contact with the areas where a component is placed in the double-sided printed circuit boards 52 joined together by the connection portion 53b.

If the connection portion 53 is cut with a router or the like with silk and a resist being applied to the connection portion 53 in this manner, the production of shavings is more reduced than when silk and a resist are not applied.

As described above, according to the present exemplary embodiment, a double-sided printed circuit board is divided with silk and a resist being applied to connection portions of the double-sided printed circuit board. This reduces shavings and also eliminates a working process for measures against shavings after cutting.

In the first to third exemplary embodiments, the description has been given of a printed circuit board provided in an exposure unit of an image forming apparatus. An apparatus to which the present invention is applied, however, is not limited to an image forming apparatus. Alternatively, the present invention is applicable to an apparatus having a printed circuit board manufactured by dividing the printed circuit board by a division process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-248172, filed Dec. 8, 2014, which is hereby incorporated by reference herein in its entirety.

What is claimed is:

1. A printed circuit board of which a part of at least one side is divided by a division process, the printed circuit board comprising:
   a first area where a component is placed; and
   a divided portion where the component is not placed, and which includes the part of the at least one side,
   wherein silk print is given an entire area of the divided portion and not applied to an entire area of the first area.

2. The printed circuit board according to claim 1, wherein the printed circuit board is a double-sided board, and the print is given entire areas of both surfaces of the divided portion.

3. The printed circuit board according to claim 1, wherein the printed circuit board is a double-sided board, print is given an entire area of a first surface of the divided portion, and a resist is applied to an entire area of a second surface of the divided portion.

4. The printed circuit board according to claim 1, wherein an area which was given the silk print is applied in contact with the first area.

5. The printed circuit board according to claim 1, wherein the division process is performed by a router.

6. An exposure device comprising:
   a printed circuit board having a driving circuit for emitting light,
   wherein the printed circuit board is a printed circuit board of which a part of at least one side is divided by a division process, the printed circuit board including:
   a first area where a component is placed; and
   a divided portion where the component is not placed, and which includes the part of the at least one side, and
   wherein silk print is given an entire area of the divided portion and not applied to an entire area of the first area.

7. The exposure device according to claim 6, wherein the printed circuit board is a double-sided board, and the silk print is given entire areas of both surfaces of the divided portion.

8. The exposure device according to claim 6, wherein the printed circuit board is a double-sided board, silk print is given an entire area of a first surface of the divided portion, and a resist is applied to an entire area of a second surface of the divided portion.

9. The exposure device according to claim 6, wherein an area which was given the silk print is applied in contact with the first area.

10. The exposure device according to claim 6, further comprising a light-emitting element configured to emit laser, wherein the driving circuit drives the light-emitting element.

11. The exposure device according to claim 6, wherein the division process is performed by a router.

12. An image forming apparatus comprising:
an image bearing member on which an image is formed;
an exposure unit configured to form a latent image on the image bearing member;
a developing unit configured to develop the latent image formed on the image bearing member; and
a transfer unit configured to transfer the image developed on the image bearing member,
wherein the exposure unit has a driving circuit for emitting light, and includes a printed circuit board of which a part of at least one side is divided by a division process,
wherein the printed circuit board includes:
a first area where a component is placed; and
a divided portion where the component is not placed, and which includes the part of the at least one side, and
wherein silk print is given an entire area of the divided portion and not applied to an entire area of the first area.

13. The image forming apparatus according to claim 12, further comprising an intermediate transfer member onto which the image is transferred by the transfer unit.

14. The image forming apparatus according to claim 13, further comprising a light-emitting element configured to emit laser, wherein the driving circuit drives the light-emitting element.

15. The image forming apparatus according to claim 12, wherein the division process is performed by a router.

16. A printed circuit board of which a part of at least one side is divided by a division process, the printed circuit board comprising:
a first area where a component is placed; and
a divided portion where the component is not placed, and which includes the part of the at least one side,
wherein silk print is given an entire area of the divided portion and not applied to an entire area of the first area; and
wherein the division process comprises a rotating cutting tool.

* * * * *